United States Patent
Liu et al.

(10) Patent No.: US 11,417,803 B2
(45) Date of Patent: Aug. 16, 2022

(54) BACKPLATE MANUFACTURING METHOD

(71) Applicant: Shenzhen China Star Optoelectronics Semiconductor Display Technology Co., Ltd., Shenzhen (CN)

(72) Inventors: Junling Liu, Shenzhen (CN); Xin Zhang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 403 days.

(21) Appl. No.: 16/647,546

(22) PCT Filed: Dec. 30, 2019

(86) PCT No.: PCT/CN2019/129731
§ 371 (c)(1),
(2) Date: Mar. 16, 2020

(87) PCT Pub. No.: WO2021/114430
PCT Pub. Date: Jun. 17, 2021

(65) Prior Publication Data
US 2021/0408337 A1 Dec. 30, 2021

(30) Foreign Application Priority Data
Dec. 12, 2019 (CN) .......................... 201911278099.0

(51) Int. Cl.
*H01L 33/42* (2010.01)
*H01L 33/08* (2010.01)
*H01L 27/32* (2006.01)
*H01L 25/075* (2006.01)
*H01L 33/62* (2010.01)

(52) U.S. Cl.
CPC .......... *H01L 33/42* (2013.01); *H01L 25/0753* (2013.01); *H01L 27/3248* (2013.01); *H01L 27/3276* (2013.01); *H01L 33/08* (2013.01); *H01L 33/62* (2013.01); *H01L 2933/0016* (2013.01)

(58) Field of Classification Search
CPC ... H01L 33/62; H01L 25/753; H01L 27/3248; H01L 33/3276; H01L 33/42
See application file for complete search history.

(56) References Cited

FOREIGN PATENT DOCUMENTS

| CN | 107946415 | 4/2018 |
|---|---|---|
| CN | 109786421 | 5/2019 |

(Continued)

*Primary Examiner* — Savitri Mulpuri

(57) ABSTRACT

The present invention provides a backplate manufacturing method including: manufacturing a second metal layer on an underlay substrate; patterning the second metal layer to form an anode and a cathode; forming a first passivation layer on the second metal layer, patterning the first passivation layer to form an aperture region, wherein the aperture region is configured to expose out the anode and the cathode; manufacturing a second passivation layer on the first passivation layer, the anode, and the cathode; manufacturing a light shielding layer on the second passivation layer, patterning the light shielding layer to remove a part of the light shielding layer in a position corresponding to the aperture region; and removing a part of the second passivation layer above the anode and the cathode. The method of the present invention can provide a soldering effect of the light emitting device and a yield rate of a backplate.

13 Claims, 5 Drawing Sheets

(56) References Cited

FOREIGN PATENT DOCUMENTS

| | | |
|---|---|---|
| CN | 110112141 | 8/2019 |
| JP | 2019-028284 | 2/2019 |
| KR | 10-2019-0127418 | 11/2019 |

BACKPLATE MANUFACTURING METHOD

RELATED APPLICATIONS

This application is a National Phase of PCT Patent Application No. PCT/CN2019/129731 having International filing date of Dec. 30, 2019, which claims the benefit of priority of Chinese Patent Application No. 201911278099.0 filed on Dec. 12, 2019. The contents of the above applications are all incorporated by reference as if fully set forth herein in their entirety.

FIELD AND BACKGROUND OF THE INVENTION

The present invention relates to a field of display technologies, especially relates to a backplate manufacturing method.

Taking light emitting device as a Mini-LED as an example, a light shielding layer needs to be manufactured in the existing backplate production to avoid the effect of light on the performance of the device. The light shielding layer is manufactured and acquired by washing, adhesive coating, exposing, and developing processes. During manufacture of the backplate, in formation of a transparent conductive layer, an insulation layer above the transparent conductive layer has a part corresponding to a bonding region is defined with a hole to expose a metal layer under a bottom thereof to facilitate soldering the Mini-LED.

SUMMARY OF THE INVENTION

During manufacture of a light shielding layer, because a metal layer (Al, Cu, etc.) is exposed, a developer corrodes the metal layer, and even a part of the metal will spread to a light shielding layer to forma development barrier layer, which results in residue of the light shielding layer above the metal layer. Furthermore, baking the light shielding layer also oxidizes the exposed metal layer to influence a soldering effect of the light emitting device, which lowers a yield rate of the backplate.

Therefore, it is necessary to provide a backplate manufacturing method to solve the issue of the prior art.

An objective of the present invention is to provide a backplate manufacturing method to prevent erosion and oxidization of a metal layer and improve a soldering effect and a production rate of a backplate of a light emitting device.

To solve the above technical issue, the present invention provides a backplate manufacturing method, comprising:

manufacturing a second metal layer on an underlay substrate;

patterning the second metal layer to form an anode and a cathode;

forming a first passivation layer on the second metal layer, patterning the first passivation layer to form an aperture region, wherein the aperture region is configured to expose out the anode and the cathode;

manufacturing a second passivation layer on the first passivation layer, the anode, and the cathode;

manufacturing a light shielding layer on the second passivation layer, patterning the light shielding layer to remove a part of the light shielding layer in a position corresponding to the aperture region; and removing a part of the second passivation layer above the anode and the cathode.

Advantages of the present invention are as follows: The backplate manufacturing method of the present invention comprises: manufacturing a second metal layer on an underlay substrate; patterning the second metal layer to form an anode and a cathode; forming a first passivation layer on the second metal layer, patterning the first passivation layer to form an aperture region, wherein the aperture region is configured to expose out the anode and the cathode; manufacturing a second passivation layer on the first passivation layer, the anode, and the cathode; manufacturing a light shielding layer on the second passivation layer, patterning the light shielding layer to remove a part of the light shielding layer in a position corresponding to the aperture region; and removing a part of the second passivation layer above the anode and the cathode. Because the second passivation layer is formed on the anode and the cathode in advance before patterning the light shielding layer, the developer is prevented from corroding the second metal layer and the metal is prevented from spreading to the light shielding layer, which improves a soldering effect of the light emitting device and a yield rate of a backplate.

DESCRIPTION OF SPECIFIC EMBODIMENTS OF THE INVENTION

Figure 1:
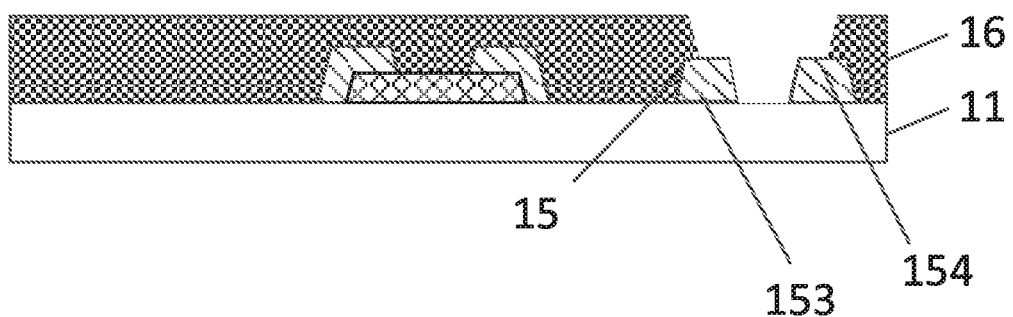
FIG. 1 is a schematic structural view of a first step to a third step of a backplate manufacturing method of a first embodiment of the present invention.

The embodiments as follows refer to the accompanying drawings for illustrating specific embodiments of the present invention that can be embodied. Directional terminologies mentioned by the present invention, for example "upper", "lower", "front", "rear", "left", "right", "top", "bottom", etc., only refer to directions of the accompanying drawings. Therefore, the employed directional terminologies are configured to indicate and make understanding for the present invention but is not for limiting the present invention. In the drawings, units with similar structures are marked with similar reference characters.

The specification and claims of the present invention and terminologies "first", "second", etc. in the above accompanying drawings are configured to distinguish similar objects and are not configured to describe a specific sequence or order thereof. Furthermore, terminologies "include", "have" and any variant thereof are intended to inclusive inclusion instead of exclusive inclusion.

Figure 2:
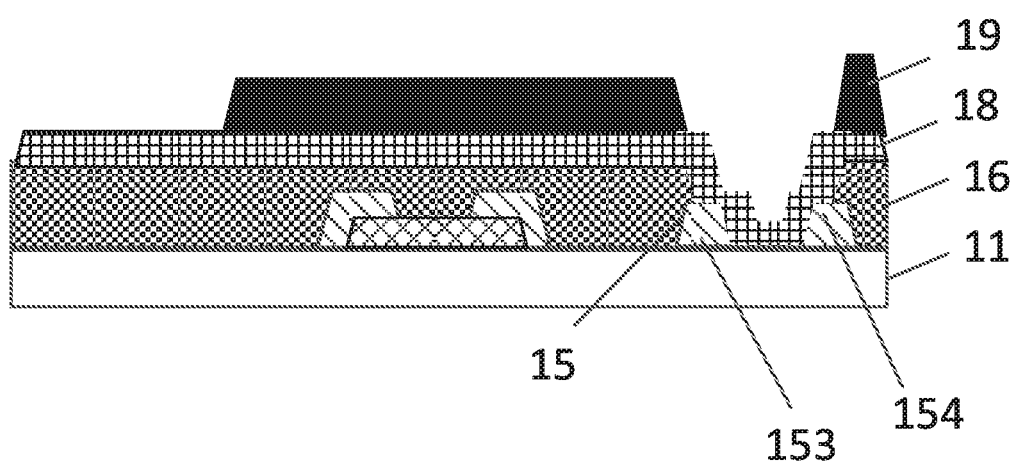
FIG. 2 is a schematic structural view of a fourth step and a fifth step of the backplate manufacturing method of the first embodiment of the present invention.
Figure 3:
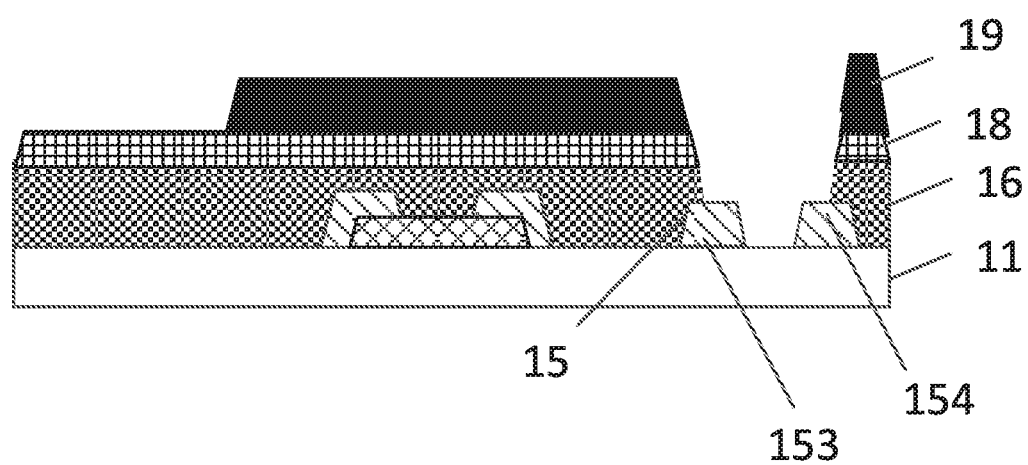
FIG. 3 is a schematic structural view of a sixth step of the backplate manufacturing method of first embodiment of the present invention.

With reference to FIGS. 1 to 3, a backplate manufacturing method provided by the present invention embodiment comprises steps S101 to S106 as follows.

The step S101 comprises a second metal layer manufacturing on an underlay substrate.

For example, with reference to FIG. 1, the second metal layer 15 is manufactured on the underlay substrate 11. A material of the second metal layer 15 can be aluminum or copper.

The step S102 comprises patterning the second metal layer to form an anode and a cathode.

For example, with reference to FIG. 1, the second metal layer 15 patterned to form the anode 153 and the cathode 154.

The step S103 comprises forming a first passivation layer on the second metal layer, patterning the first passivation layer to form an aperture region, wherein the aperture region is configured to expose out the anode and the cathode.

For example, with reference to FIG. 1, the first passivation layer 16 is formed on the second metal layer 15, the first passivation layer 16 is patterned to form the aperture region (not shown in the figures). The aperture region is configured to expose out the anode 153 and the cathode 154.

The step S104 comprises manufacturing a second passivation layer on the first passivation layer, the anode, and the cathode.

For example, with reference to FIG. 2, second passivation layer 18 is manufactured on the first passivation layer 16, the anode 153, and the cathode 154.

The step S105 comprises manufacturing a light shielding layer on the second passivation layer, patterning the light shielding layer to remove a part of the light shielding layer in a position corresponding to the aperture region.

For example, the light shielding layer 19 is manufactured on the second passivation layer 18, the light shielding layer 19 is patterned to remove the part of the light shielding layer 19 corresponding to the aperture region. The patterning here can include processes including exposure and development. A developer is usually used during the development.

The step S106 comprises removing a part of the second passivation layer above the anode and the cathode.

For example, with reference to FIG. 3, the part of the second passivation layer 18 above the anode 153 and the cathode 154 is removed such that the anode and the cathode is exposed out for bonding the light emitting device. The light emitting device can comprise one of a Micro-LED, an OLED, and a Mini-LED.

Because the present embodiment forms the second passivation layer on the anode and the cathode in advance before patterning the light shielding layer, the developer is prevented from corroding the second metal layer and the metal is prevented from spreading to the light shielding layer, which improves a soldering effect of the light emitting device and a yield rate of a backplate.

Figure 4:
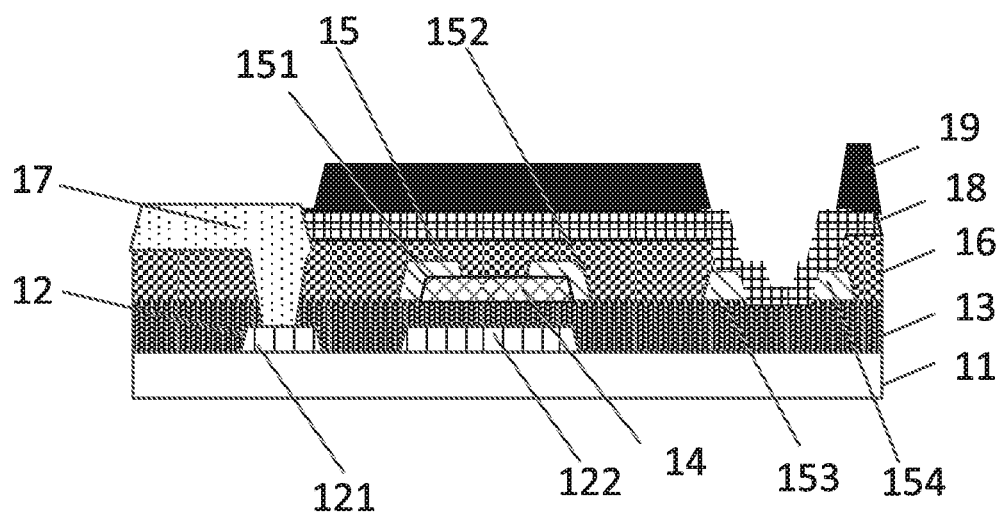
FIG. 4 is a schematic structural view of a first step to an eighth step of a backplate manufacturing method of a second embodiment of the present invention.
Figure 5:
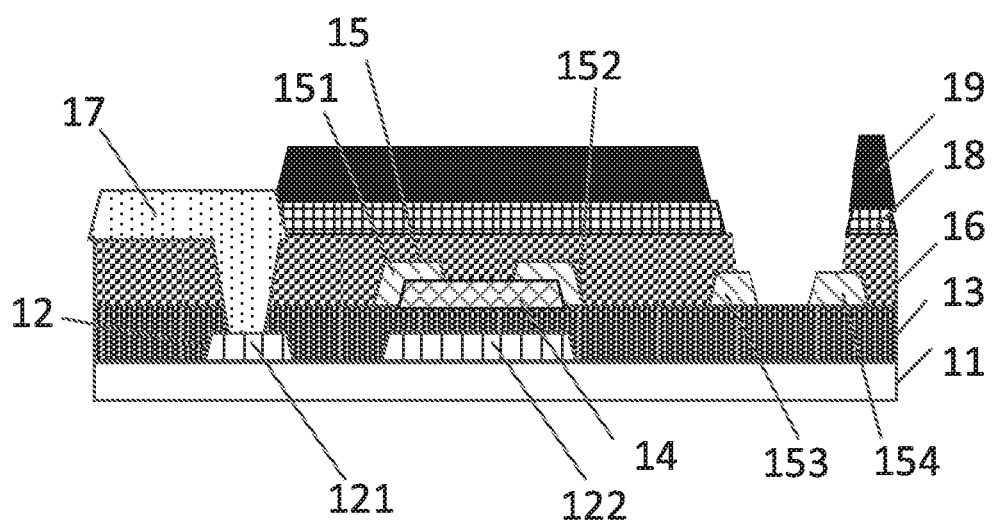
FIG. 5 is a schematic structural view of a ninth step of the backplate manufacturing method of the second embodiment of the present invention.

With reference to FIGS. 4 and 5, the backplate manufacturing method provided by a second embodiment of the present invention comprises steps S201 to S210 as follows.

The step S201 comprises manufacturing a first metal layer on the underlay substrate, patterning the first metal layer to form a gate electrode and a connection wire.

The backplate comprises a connection region.

For example, with reference to FIG. 4, the first metal layer 12 is manufactured on the underlay substrate 11, the first metal layer 12 is patterned to form the connection wire 121 and the gate electrode 122. Then, an insulation layer 13 can formed on the gate electrode 121 and the connection wire 122.

The step S202 comprises manufacturing a semiconductor layer on the first metal layer.

For example, In an embodiment, the semiconductor layer 14 is formed on the insulation layer 13.

The step S203 comprises manufacturing a second metal layer on the semiconductor layer.

For example, with reference to FIG. 4, the second metal layer 15 is manufactured on the semiconductor layer 14. A material of the second metal layer 15 can be aluminum or copper.

The step S204 comprises patterning the second metal layer to form an anode and a cathode.

For example, with reference to FIG. 4, the second metal layer 15 is patterned to form the source electrode 151, the drain electrode 152, the anode 153, and the cathode 154. The source electrode 151 and the drain electrode 152 are connected to the semiconductor layer 14.

The step S205 comprises forming a first passivation layer on the second metal layer, patterning the first passivation layer to form an aperture region, wherein the aperture region is configured to expose out the anode and the cathode.

For example, with reference to FIG. 4, the first passivation layer 16 is formed on the second metal layer 15, the first passivation layer 16 is patterned to form the aperture region (not shown in the figures). The aperture region is configured to expose out the anode 153 and the cathode 154.

The step S206 comprises manufacturing a transparent conductive layer on a part of the first passivation layer in the connection region.

For example, the transparent conductive layer 17 is manufactured on the part of the first passivation layer 16 above the connection region. A position of the connection region corresponds to a position of the connection wire 121. A material of the transparent conductive layer 17 is indium tin oxide (ITO). The transparent conductive layer 17 is connected to the connection wire 121.

The step S207 comprises manufacturing a second passivation layer on the first passivation layer and the anode and the cathode.

For example, with reference to FIG. 4, the second passivation layer 18 is manufactured on the first passivation layer 16, the anode 153, and the cathode 154. A material of the second passivation layer 18 can include at least one of SiNx and SiO2.

The step S208 comprises manufacturing a light shielding layer on the second passivation layer, patterning the light shielding layer to remove a part of the light shielding layer in a position corresponding to the aperture region.

For example, the light shielding layer 19 is manufactured on the second passivation layer 18, the light shielding layer 19 is patterned to remove the part of the light shielding layer 19 corresponding to the aperture region. A material of the light shielding layer 19 is preferably a black photoresist.

The step S209 comprises removing a part of the second passivation layer above the anode and the cathode.

For example, with reference to FIG. 5, the part of the second passivation layer 18 above the anode 153 and the cathode 154 is removed to expose out the anode 153 and the cathode 154 such that the light emitting device is bonded. The light emitting device can comprise one of a Micro-LED, an OLED, and a Mini-LED.

In an embodiment, to prevent corrosion of the anode and the cathode, the step of removing the part of the second passivation layer above the anode and the cathode can comprise:

A step S2091, removing the part of the second passivation layer above the anode and the cathode by a dry etching process.

For example, the patterned light shielding layer 18 serves as a blocking body to dry etch the second passivation layer to expose a bonding region (corresponding to the aperture region), and then a washing process or a releasing process is performed to clean the residue on surfaces of the anode and the cathode. The bonding region is configured to bond the light emitting device. In other words, the bonding region corresponds to a position of the aperture region.

The step S210 comprises bonding a light emitting device to the aperture region, wherein a first end of the light emitting device is connected to the anode, a second end of the light emitting device is connected to the cathode.

A first end of the light emitting device is an anode, and a second end of the light emitting device is a cathode.

In an embodiment, the further improve the display effect, the light emitting device is a micro-light emitting diode.

In another embodiment, the after the step of manufacturing the second passivation layer on the first passivation layer and before the step of manufacturing the light shielding layer on the second passivation layer, the method further comprises:

a step S208', annealing the transparent conductive layer 17.

The annealing process can reduce a resistance of the transparent conductive layer 17 to further improve a conductivity. Because the transparent conductive layer 17 is annealed after the second passivation layer 18 is manufactured, the exposed anode and cathode are prevented from oxidization, which further enhances the soldering effect of the light emitting device.

The backplate manufacturing method of the present invention comprises: manufacturing a second metal layer on an underlay substrate; patterning the second metal layer to form an anode and a cathode; forming a first passivation layer on the second metal layer, patterning the first passivation layer to form an aperture region, wherein the aperture region is configured to expose out the anode and the cathode; manufacturing a second passivation layer on the first passivation layer, the anode, and the cathode; manufacturing a light shielding layer on the second passivation layer, patterning the light shielding layer to remove a part of the light shielding layer in a position corresponding to the aperture region; and removing a part of the second passivation layer above the anode and the cathode. Because the second passivation layer is formed on the anode and the cathode in advance before patterning the light shielding layer, the developer is prevented from corroding the second metal layer and the metal is prevented from spreading to the light shielding layer, which improves a soldering effect of the light emitting device and a yield rate of a backplate.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. A backplate manufacturing method, comprising:
    manufacturing a second metal layer on an underlay substrate;
    patterning the second metal layer to form an anode and a cathode;
    forming a first passivation layer on the second metal layer, patterning the first passivation layer to form an aperture region, wherein the aperture region is configured to expose out the anode and the cathode;
    manufacturing a second passivation layer on the first passivation layer, the anode, and the cathode;
    manufacturing a light shielding layer on the second passivation layer, patterning the light shielding layer to remove a part of the light shielding layer in a position corresponding to the aperture region; and
    removing a part of the second passivation layer above the anode and the cathode;
    wherein the backplate comprises a connection region; before the step of manufacturing the second passivation layer on the first passivation layer, the method further comprises: manufacturing a transparent conductive layer on a part of the first passivation layer in the connection region;
    wherein the method further comprises: bonding a light emitting device to the aperture region, wherein a first end of the light emitting device is connected to the anode, a second end of the light emitting device is connected to the cathode;
    wherein the backplate comprises a connection region; before the step of manufacturing the second passivation layer on the first passivation layer, the method further comprises: manufacturing a transparent conductive layer on a part of the first passivation layer in the connection region;
    wherein before the step of manufacturing the second metal layer on the underlay substrate, the method further comprises: manufacturing a first metal layer on the underlay substrate, patterning the first metal layer to form a gate electrode and a connection wire, wherein the transparent conductive layer is connected to the connection wire;
    wherein the method further comprises: bonding a light emitting device to the aperture region, wherein a first end of the light emitting device is connected to the anode, a second end of the light emitting device is connected to the cathode.

2. The backplate manufacturing method as claimed in claim 1, wherein the step of removing the part of the second passivation layer above the anode and the cathode comprises:
    removing the part of the second passivation layer above the anode and the cathode by a dry etching process.

3. The backplate manufacturing method as claimed in claim 1, wherein the after the step of manufacturing the second passivation layer on the first passivation layer and before the step of manufacturing the light shielding layer on the second passivation layer, the method further comprises:
    annealing the transparent conductive layer.

4. The backplate manufacturing method as claimed in claim 1, wherein before the step of manufacturing the second metal layer on the underlay substrate, the method further comprises:
    manufacturing a first metal layer on the underlay substrate, patterning the first metal layer to form a gate electrode and a connection wire, wherein the transparent conductive layer is connected to the connection wire.

5. The backplate manufacturing method as claimed in claim 4, wherein after the step of manufacturing the first metal layer on the underlay substrate and before the step of manufacturing the second metal layer on the underlay substrate, the method further comprises:
    manufacturing a semiconductor layer on the first metal layer.

6. The backplate manufacturing method as claimed in claim 5, wherein the step of patterning the second metal layer comprises:

patterning the second metal layer to form a source electrode and a drain electrode, wherein the source electrode and the drain electrode are connected to the semiconductor layer.

7. The backplate manufacturing method as claimed in claim 1, wherein the light emitting device is a micro-light emitting diode.

8. The backplate manufacturing method as claimed in claim 1, wherein a material of the light shielding layer is a black photoresist.

9. A backplate manufacturing method, comprising:
manufacturing a second metal layer on an underlay substrate;
patterning the second metal layer to form an anode and a cathode;
forming a first passivation layer on the second metal layer, patterning the first passivation layer to form an aperture region, wherein the aperture region is configured to expose out the anode and the cathode;
manufacturing a second passivation layer on the first passivation layer, the anode, and the cathode;
manufacturing a light shielding layer on the second passivation layer, patterning the light shielding layer to remove a part of the light shielding layer in a position corresponding to the aperture region; and
removing a part of the second passivation layer above the anode and the cathode by a dry etching process;
wherein a material of the light shielding layer is a black photoresist; and
wherein the backplate comprises a connection region; before the step of manufacturing
the second passivation layer on the first passivation layer, the method further comprises: manufacturing a transparent conductive layer on a part of the first passivation layer in the connection region;
wherein before the step of manufacturing the second metal layer on the underlay substrate, the method further comprises: manufacturing a first metal layer on the underlay substrate, patterning the first metal layer to form a gate electrode and a connection wire, wherein the transparent conductive layer is connected to the connection wire; and the black plate further comprises bonding a light emitting device to the aperture region, wherein a first end of the light emitting device is connected to the anode, a second end of the light emitting device is connected to the cathode.

10. The backplate manufacturing method as claimed in claim 9, wherein after the step of manufacturing the second passivation layer on the first passivation layer and before the step of manufacturing the light shielding layer on the second passivation layer, the method further comprises:
annealing the transparent conductive layer.

11. The backplate manufacturing method as claimed in claim 9, wherein after the step of manufacturing the first metal layer on the underlay substrate and before the step of manufacturing the second metal layer on the underlay substrate, the method further comprises:
manufacturing a semiconductor layer on the first metal layer.

12. The backplate manufacturing method as claimed in claim 11, wherein the step of patterning the second metal layer comprises:
patterning the second metal layer to form a source electrode and a drain electrode, wherein the source electrode and the drain electrode are connected to the semiconductor layer.

13. The backplate manufacturing method as claimed in claim 9, wherein the light emitting device is a micro-light emitting diode.

* * * * *